(12) United States Patent
Pak et al.

(10) Patent No.: US 10,854,981 B2
(45) Date of Patent: Dec. 1, 2020

(54) COMMUNICATION APPARATUS

(71) Applicant: Sony Interactive Entertainment Inc., Tokyo (JP)

(72) Inventors: Masayuki Pak, Kanagawa (JP); Tetsufumi Nozawa, Chiba (JP)

(73) Assignee: Sony Interactive Entertainment Inc., Tokyo (JP)

( * ) Notice: Subject to any disclaimer, the term of this patent is extended or adjusted under 35 U.S.C. 154(b) by 265 days.

(21) Appl. No.: 15/887,413

(22) Filed: Feb. 2, 2018

(65) Prior Publication Data
US 2018/0233825 A1 Aug. 16, 2018

(30) Foreign Application Priority Data
Feb. 16, 2017 (JP) ................................ 2017-027025

(51) Int. Cl.
H01Q 9/04 (2006.01)
H01Q 1/48 (2006.01)
(Continued)

(52) U.S. Cl.
CPC ............ H01Q 9/045 (2013.01); H01P 3/006 (2013.01); H01P 5/028 (2013.01); H01P 11/001 (2013.01);
(Continued)

(58) Field of Classification Search
CPC ........ H01Q 9/045; H01Q 1/48; H01Q 9/0421; H05K 1/0237; H05K 1/10268;
(Continued)

(56) References Cited

U.S. PATENT DOCUMENTS 5,961,349 A 10/1999 Paagman
6,196,876 B1 3/2001 Paagman
(Continued)

FOREIGN PATENT DOCUMENTS

CN 1152972 A 6/1997
CN 101112135 A 1/2008
(Continued)

OTHER PUBLICATIONS

Extended Search Report for corresponding EP Application No. 18153621.0, 13 pages, dated Jul. 12, 2018.
(Continued)

*Primary Examiner* — Hoang V Nguyen
(74) *Attorney, Agent, or Firm* — Matthew B. Dernier, Esq.

(57) ABSTRACT

A communication apparatus includes a signal line that connects an antenna and a wireless communication module to each other, the signal line having a portion where the signal line is divided in part into sections, with an adjacent portion adjacent to the divided portion of the signal line being greater in line width than a main body portion of the signal line; a first ground pattern disposed to face the main body portion; and a second ground pattern disposed to face the adjacent portion. The distance from the adjacent portion to the second ground pattern is longer than the distance from the main body portion to the first ground pattern. The antenna and the wireless communication module are connected to each other through the signal line and a solder adhered to the adjacent portion.

8 Claims, 3 Drawing Sheets

(51) Int. Cl.
*H05K 1/02* (2006.01)
*H05K 1/11* (2006.01)
*H05K 3/34* (2006.01)
*H01P 11/00* (2006.01)
*H05K 1/18* (2006.01)
*H01P 5/02* (2006.01)
*H01P 3/00* (2006.01)

(52) U.S. Cl.
CPC ............. *H01Q 1/48* (2013.01); *H05K 1/0237* (2013.01); *H05K 1/0253* (2013.01); *H05K 1/115* (2013.01); *H05K 1/18* (2013.01); *H05K 3/34* (2013.01); *H01Q 9/0421* (2013.01); *H05K 1/0268* (2013.01); *H05K 1/117* (2013.01); *H05K 2201/093* (2013.01); *H05K 2201/09309* (2013.01); *H05K 2201/09727* (2013.01); *H05K 2201/10098* (2013.01)

(58) Field of Classification Search
CPC . H05K 1/115; H05K 1/18; H05K 3/34; H05K 2201/10098; H05K 1/0253; H01P 5/028; H01P 3/006
See application file for complete search history.

(56) References Cited

U.S. PATENT DOCUMENTS

| | | |
|---|---|---|
| 9,313,890 B2 | 4/2016 | Chuo |
| 9,445,489 B2 | 9/2016 | Nishimura |
| 2013/0049880 A1* | 2/2013 | Oh .......................... H01P 5/028 333/32 |
| 2013/0113117 A1 | 5/2013 | Haralabidis |
| 2014/0266972 A1* | 9/2014 | Yang ...................... H01Q 1/243 343/893 |
| 2015/0102874 A1 | 4/2015 | Chuo |
| 2015/0183456 A1 | 7/2015 | Nishimura |

FOREIGN PATENT DOCUMENTS

| | | |
|---|---|---|
| CN | 101232695 A | 7/2008 |
| CN | 103281144 A | 9/2013 |
| CN | 104582260 A | 4/2015 |
| CN | 104742961 A | 7/2015 |
| CN | 205941717 U | 2/2017 |
| JP | 09257852 A | 10/1997 |
| JP | 2008306087 A | 12/2008 |

OTHER PUBLICATIONS

Wanlan Yang et al: "A 60GHz on-chip antenna in standard CMOS silicon Technology", Circuits and Systems (APCCAS), 2012 IEEE Asia Pacific Conference on, IEEE, 4 pages, (Dec. 2, 2012).

Notification of Refusal for corresponding JP Application No. 12017-027025, 9 pages, dated Jan. 29, 2019.

The First Office Action for corresponding CN Application No. 2018101331122, 20 pages, dated Dec. 27, 2019.

* cited by examiner

COMMUNICATION APPARATUS

BACKGROUND

The present disclosure relates to a communication apparatus for carrying out wireless communication, and to a method of manufacturing the same.

In manufacturing a communication apparatus provided with an antenna and a wireless communication module for wireless communication, there are cases where calibration of each wireless communication module is conducted in a state in which the wireless communication module is mounted on a circuit board. Setpoints such as transmission power on which the results of the calibration have been reflected are set in the individual communication apparatus, whereby wireless communication can be realized in favorable conditions.

SUMMARY

In order to perform the above-mentioned calibration, conventionally, a switch element such as a radio frequency (RF) switch is disposed on a signal line (feeder line) for connection between the wireless communication module and the antenna, and a measuring apparatus and the wireless communication module are connected to each other through the switch element. However, such a switch element would cause an increase in the manufacturing cost of the communication apparatus, notwithstanding the switch element is needless after the completion of the calibration.

Thus, there is a need for a communication apparatus in which calibration of a wireless communication module mounted on a circuit board can be carried out while suppressing the manufacturing cost, and for a method of manufacturing the same.

In an embodiment of the present disclosure, there is provided a communication apparatus including a signal line that connects an antenna and a wireless communication module to each other, the signal line having a portion where the signal line is divided in part into sections, with an adjacent portion adjacent to the divided portion of the signal line being greater in line width than a main body portion of the signal line; a first ground pattern disposed to face the main body portion; and a second ground pattern disposed to face the adjacent portion, in which the distance from the adjacent portion to the second ground pattern is longer than the distance from the main body portion to the first ground pattern, and the antenna and the wireless communication module are connected to each other through the signal line and a solder adhered to the adjacent portion.

In another embodiment of the present disclosure, there is provided a method of manufacturing a communication apparatus, the method including: forming a signal line, a first ground pattern, and a second ground pattern, the signal line being for connection between an antenna and a wireless communication module, the signal line having a portion where the signal line is divided in part into sections, with an adjacent portion adjacent to the divided portion of the signal line being greater in line width than a main body portion of the signal line, the first ground pattern facing the main body portion, and the second ground pattern facing the adjacent portion; connecting a measuring apparatus to the signal line at a position more on the wireless communication module side than the adjacent portion and performing measurement of the wireless communication module; and soldering the divided portion to connect the wireless communication module and the antenna to each other, after the measurement of the wireless communication module is performed.

DETAILED DESCRIPTION OF THE PREFERRED EMBODIMENT

Figure 1:
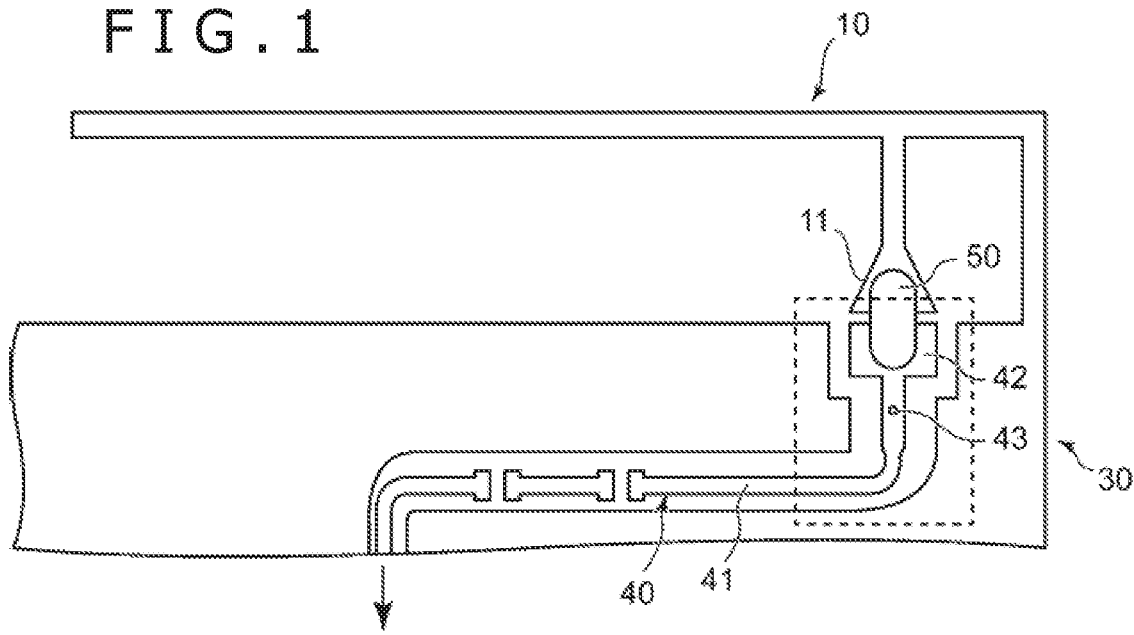
FIG. 1 is a plan view illustrating an outline of a multilayer board possessed by a communication apparatus according to an embodiment of the present disclosure.

An embodiment of the present disclosure will be described in detail below referring to the drawings.

A communication apparatus 1 according to an embodiment of the present disclosure may be, for example, a personal computer, a stationary type game machine, a game machine controller, a portable game machine, a smartphone or the like. FIG. 1 is a plan view illustrating an outline of a multilayer board possessed by the communication apparatus 1. As illustrated in the figure, the communication apparatus 1 includes: an antenna 10 for wireless communication with other communication apparatuses, an access point and the like; a wireless communication module 20 for controlling the wireless communication conducted through the antenna 10; a multilayer board 30 on which the wireless communication module 20 is mounted; and a signal line 40 which is formed in the multilayer board 30 and connects the wireless communication module 20 and the antenna 10 to each other.

The multilayer board 30 has three or more layers of pattern wiring (hereinafter referred to as pattern layers). In this embodiment, a total of four pattern layers are provided which includes a first pattern layer P1 formed on a front surface of the multilayer board 30, a second pattern layer P2 and a third pattern layer P3 which are formed inside the multilayer board 30, and a fourth pattern layer P4 formed on a back surface of the multilayer board 30. Base material layers B1 to B3 formed of dielectric are formed between the plurality of pattern layers.

Figure 4:
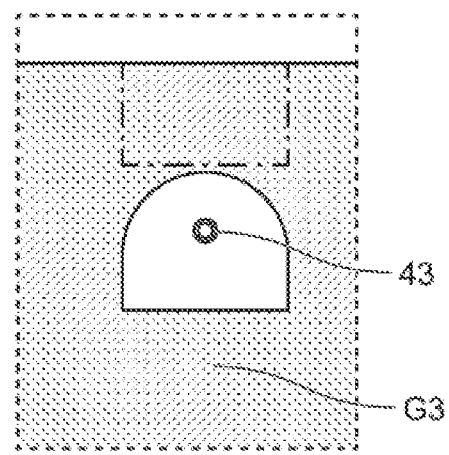
FIG. 4 is a partial enlarged view illustrating a part of a pattern formed in a third pattern layer of the multilayer board.
Figure 5:
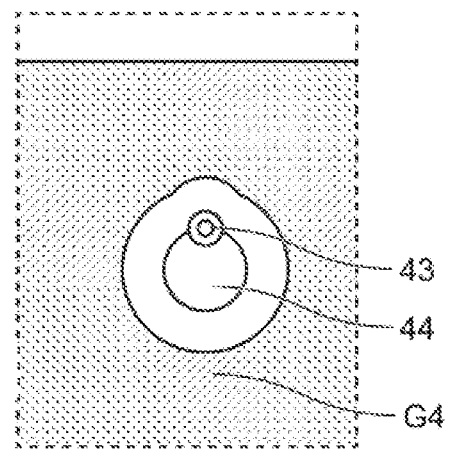
FIG. 5 is a partial enlarged view illustrating a part of a pattern formed in a fourth pattern layer of the multilayer board.
Figure 6:
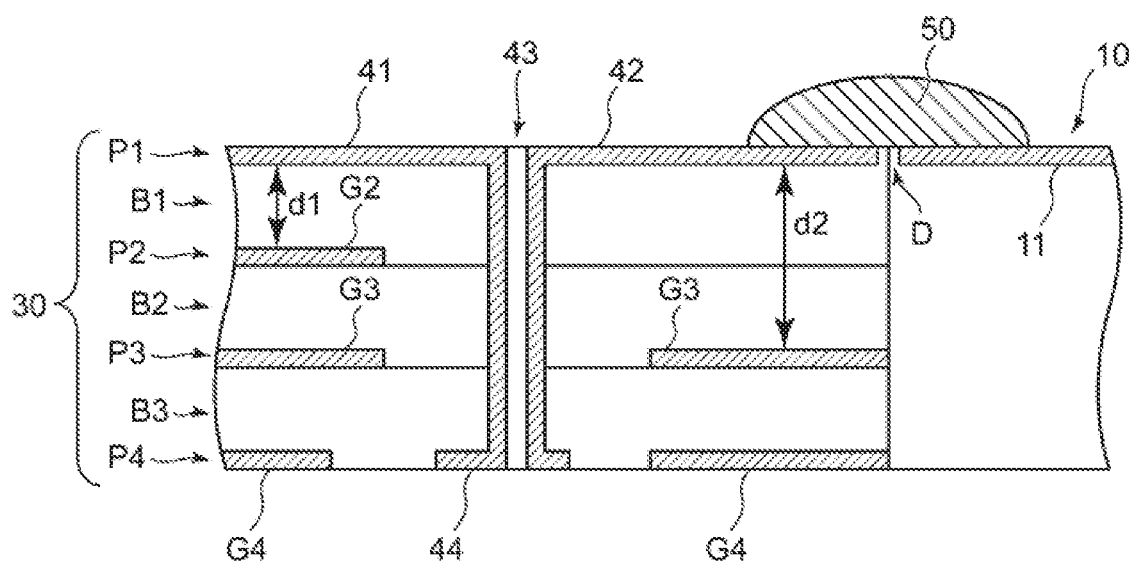
FIG. 6 is a sectional view schematically illustrating a section of the multilayer board.

FIGS. 2 to 5 are partial enlarged views illustrating parts of patterns formed in the first to fourth pattern layers P1 to P4. In each of these figures, the vicinity of an end portion of the signal line 40 that is on the antenna 10 side (the part surrounded by a broken line in FIG. 1) is illustrated in an enlarged form. In addition, FIG. 6 is a sectional view schematically illustrating a section of the multilayer board 30 in this region, and illustrates a state in which the multilayer board 30 is cut along an extending direction of the signal line 40.

The antenna 10 is an inverted F antenna, and is formed of a pattern in the first pattern layer P1, as illustrated in FIG. 1. The wireless communication module 20 is connected to the antenna 10 through the signal line 40, and controls wireless communication performed through the antenna 10.

Figure 2:
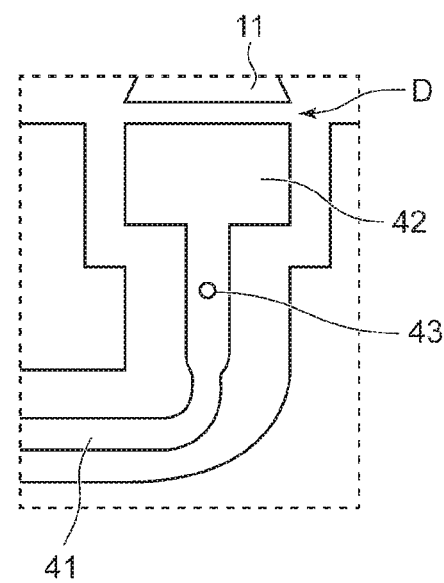
FIG. 2 is a partial enlarged view illustrating a part of a pattern formed in a first pattern layer of the multilayer board.

The signal line 40 is a pattern wiring formed between the wireless communication module 20 and the antenna 10, in the first pattern layer P1. It is to be noted, however, that the signal line 40 is not directly connected to the antenna 10 but is divided in its course into sections. Hereinafter, the portion where the signal line 40 is divided into sections at a position between the wireless communication module 20 and the antenna 10 will be referred to as the division point D. In this embodiment, as depicted in FIG. 2, the division point D is located at a boundary position between the signal line 40 and the antenna 10. In other words, the signal line 40 is divided in part into sections at a position immediately in front of connection with the antenna 10.

The signal line 40 is made greater in line width at one portion than at other portions, the one portion being located at a position on the wireless communication module 20 side as viewed from the division point D (namely, at a position immediately in front of the antenna 10). Here, the line width of the signal line 40 refers to the length (size) in the direction orthogonal to the extending direction of the signal line 40. Hereinafter, the signal line portion where the line width is greater will be referred to as a land 42, and that portion of the signal line 40 which is other than the land 42 will be referred to as a main body portion 41. That portion of the antenna 10 which is located on the opposite side of the division point D from the land 42 is also greater in width than the other portion of the antenna 10. Hereinafter, that portion of the antenna 10 which is adjacent to the signal line 40 and which is greater in width than the other portion of the antenna 10 will be referred to as a base end portion 11 of the antenna 10.

Further, the signal line 40 is formed with a through-hole 43 at a position more on the wireless communication module 20 side than the land 42. The back surface of the multilayer board 30 (namely, the fourth pattern layer P4) is formed with a measurement land 44 in a region including the through-hole 43. The measurement land 44 is in electrical conduction with the signal line 40 through the through-hole 43. Besides, as illustrated in FIG. 5, in the fourth pattern layer P4, a ground pattern G4 is disposed around the measurement land 44.

In performing calibration of the wireless communication module 20, a tip portion of a measuring probe possessed by a measuring apparatus is put into contact with a central portion of the measurement land 44, from the back surface side of the multilayer board 30. A ground terminal is disposed around the measuring probe, and, simultaneously when the tip of the measuring probe is put into contact with the measurement land 44, the ground terminal is put into contact with the ground pattern G4. In this condition, the measuring apparatus measures a signal from the wireless communication module 20. Since the signal line 40 is divided at the division point D from the antenna 10 as aforementioned, the wireless communication module 20 is not in electrical conduction with the antenna 10 at the time when the calibration is conducted. Therefore, the measuring probe is connected to the wireless communication module 20 through the measurement land 44, the through-hole 43, and the main body portion 41 of the signal line 40. Accordingly, the measuring apparatus can measure the signal from the wireless communication module 20, in an environment close to that in actual use.

After the measuring step for calibration of the wireless communication module 20 is performed, the land 42 of the signal line 40 and the base end portion 11 of the antenna 10 are electrically connected to each other by soldering. This results in that the wireless communication module 20 and the antenna 10 are electrically connected to each other through the signal line 40, and the wireless communication module 20 can perform control of the wireless communication conducted through the antenna 10. In FIGS. 1 and 6, a state in which a solder 50 is adhered by the soldering is illustrated.

Since the signal line 40 for connection between the wireless communication module 20 and the antenna 10 is thus divided at the division point D into sections, in this embodiment, calibration of the wireless communication module 20 can be performed by applying measurement using the measuring probe to the wireless communication module 20 before connection thereof to the antenna 10. Thereafter, the division point D is soldered, whereby the wireless communication module 20 and the antenna 10 are electrically connected to each other. Consequently, the calibration of the wireless communication module 20 in the state of being mounted on the multilayer board 30 can be carried out, without providing a circuit component such as an RF switch.

The land 42 is a space necessary for connecting the wireless communication module 20 and the antenna 10 by soldering after the calibration is carried out in the procedure as above-mentioned. The land 42 needs to be formed in a greater width as compared to the main body portion 41, for placing the solder 50 thereon. However, when the line width of the signal line 40 is varied at an intermediate portion of the signal line 40, the impedance of the signal line 40 may vary at that portion. Such a variation in impedance is undesirable, since it may cause deterioration of communication quality. The influence of such a variation in impedance is increased especially in the case where communication at a high frequency is conducted through the antenna 10. In view of this, in this embodiment, the distance to a reference ground in regard of the main body portion 41 and that in regard of the land 42 are made to be different, whereby fluctuation in impedance is suppressed. This will be described in detail below.

The impedance of the signal line 40 is determined not only by the line width and thickness of the signal line 40 itself but also by the distance to the reference ground, and the dielectric constant of a dielectric present between the signal line 40 and the reference ground. Here, the reference ground is that one of the ground patterns constituting a ground of a circuit which is located at a position facing the signal line 40. Accordingly, it is possible, by varying the distance from the signal line 40 to the reference ground at a place where the line width of the signal line 40 varies, to prevent the impedance of the signal line 40 from varying largely at the place.

Figure 3:
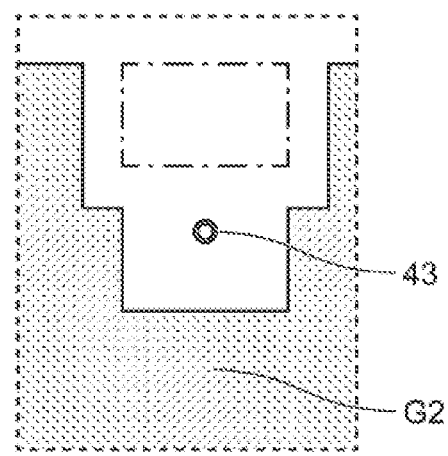
FIG. 3 is a partial enlarged view illustrating a part of a pattern formed in a second pattern layer of the multilayer board.

As illustrated in FIG. 3, in this embodiment, a ground pattern G2 is formed in that region in the second pattern layer P2 which faces the main body portion 41. Specifically, the ground pattern G2 is disposed in a direction parallel to the main body portion 41 at a position spaced from the main body portion 41 by a distance d1 corresponding to the thickness of the base material layer B1, and the spacing between the main body portion 41 and the ground pattern G2 is filled up with a dielectric constituting the base material layer B1. Therefore, for the main body portion 41, the ground pattern G2 serves as the reference ground.

In contrast, no ground pattern is formed in that region of the second pattern layer P2 which faces the land 42 (the region indicated by an alternate long and short dash line in the figure). On the other hand, as illustrated in FIG. 4, a ground pattern G3 is formed in that region of the third pattern layer P3 which faces the land 42 (the region indicated by an alternate long and short dash line in the figure). Specifically, the ground pattern G3 is disposed in a direction parallel to the land 42 and at a position spaced from the land 42 by a distance d2 corresponding roughly to the total thickness of the base material layers B1 and B2, and the spacing between the land 42 and the ground pattern G3 is filled up with dielectric constituting the base material layers B1 and B2. Therefore, for the land 42, the ground pattern G3 serves as the reference ground. This results in that, as illustrated in FIG. 6, the distance d2 from the land 42 to the reference ground is longer than the distance d1 from the main body portion 41 to the reference ground, by a length corresponding to the thickness of the base material layer B2.

The line width of the main body portion 41 and the line width of the land 42 are determined taking into account the distances to the respective reference grounds, in such a manner that the impedance of the main body portion 41 and the impedance of the land 42 coincide with each other. Consequently, the main body portion 41 and the land 42 can be prevented from differing largely from each other in impedance.

Here, since the ground patterns are disposed by utilizing the pattern layers of the multilayer board 30, it is difficult to arbitrarily control the distance from the signal line 40 to the ground pattern for convenience on a design basis, and the distance takes discrete fixed values such as, for example, the distance d1 to the second pattern layer P2 and the distance d2 to the third pattern layer P3. Therefore, the land 42 is formed such that the line width is constant throughout the land 42. Specifically, the land 42 is substantially rectangular in shape, so that its line width is different from that of the main body portion 41 but is kept at a constant value in the land 42. Consequently, the impedance can be made to be constant even in the land 42.

As for the antenna 10, in contrast, it is sufficient that the impedance of the antenna 10 as a whole can be controlled, and it is unnecessary to keep constant the impedance per unit length of the antenna 10. Therefore, the base end portion 11 of the antenna 10 is formed in a substantially triangular shape such that the line width increases as the land 42 is approached, instead of forming the base end portion 11 with a constant line width, for such reasons as enhancing the workability in soldering.

Note that while the division point D is set to be the end portion on the antenna 10 side of the signal line 40 in this embodiment, this setting is not restrictive, and the dividing the pattern into sections may be made at the position of an intermediate portion of the signal line 40. It is to be noted, however, that it is necessary in that case to provide lands for soldering on both sides of the division point D. Therefore, it is necessary to set comparatively long the region in which the line width is greater, in the course of the signal line 40. In this embodiment, on the other hand, the end portion of the signal line 40 is the division point D, and the base end portion 11 at the end of the antenna 10 is utilized as a land for soldering. For this reason, the length of the land in the signal line 40 can be shortened, as compared to the case where the division point D is disposed at an intermediate portion of the signal line 40.

The measurement land 44 with which the measuring probe is put into contact at the time of calibration needs to be located more on the wireless communication module 20 side than the division point D, in order to be electrically connected with the wireless communication module 20. Moreover, it is desirable to provide the measurement land 44 at a position as close as possible to the division point D. If the measurement land 44 is provided at a position remote from the division point D, the signal line 40 from the measurement land 44 to the division point D would act as a stub at the time of calibration, thereby influencing the accuracy of measurement. In this embodiment, therefore, the through-hole 43 is formed at a position as close as possible to the land 42, within such a range that at least a clearance necessary for separation from the ground pattern can be secured.

In addition, while the measurement land 44 is disposed on the back surface of the multilayer board 30 that is on the side opposite to the land 42 in this embodiment, the measurement land 44 may be disposed on the front surface side of the multilayer board 30 that is on the same side as the land 42. However, the measurement land 44 needs a certain extent of size, and it is necessary to provide the ground pattern around the measurement land 44. Therefore, if it is intended to dispose the measurement land 44 on the same side of the multilayer board 30 as the land 42, it would be necessary to dispose the measurement land 44 at a position spaced in a certain extent from the land 42. In that case, the signal line 40 is branched at an intermediate portion thereof, and the signal line 40 from the branching point to the land 42 acts as a stub at the time of carrying out the calibration. In addition, the signal line 40 from the branching point to the measurement land 44 acts as a stub at the time of performing wireless communication by utilizing the antenna 10. As aforementioned, such a stub influences the communication through the signal line 40, and, therefore, it is desirable to make such a stub to be as short as possible. In this embodiment, the measurement land 44 is provided on the back surface side of the multilayer board 30, whereby the length of such a stub is roughly suppressed to the length corresponding to the thickness of the multilayer board 30.

Besides, while the measurement land 44 as a whole is formed in a substantially circular shape in this embodiment, the through-hole 43 is disposed at a position deviated from the center of the measurement land 44. Therefore, the measurement land 44 has a structure in which a small-diameter circle centered at the through-hole 43 is overlapping a large-diameter circle constituting the periphery of the measurement land 44. This is for ensuring that the measuring probe does not contact the position of the through-hole 43 during when calibration is performed. If the through-hole 43 is present in the vicinity of the center of the measurement land 44, there would be a problem that when the measuring probe is brought into contact with the measurement land 44, the tip of the measuring probe comes into the through-hole 43, or the contact pressure of the measuring probe varies depending on the overlapping condition of the measuring probe and the through-hole 43. In such a situation, it is difficult to perform accurate measurement under the same conditions. In view of this, the distance from the center of the measurement land 44 to the through-hole 43 is enlarged, whereby the measuring probe is prevented from overlapping the through-hole 43 when the measuring probe is brought into contact with the vicinity of the center of the measurement land 44.

As has been described above, in the communication apparatus 1 according to this embodiment, the signal line 40 between the wireless communication module 20 and the antenna 10 is provided with the division point D, and the divided portion at the division point D is soldered after execution of calibration, whereby the calibration of the wireless communication module 20 mounted on the multilayer board 30 can be performed without use of an RF switch or the like. Further, the main body portion 41 of the signal line 40 and the land 42 made to be greater in line width than the main body portion 41 for the purpose of soldering are made to be different in distance to reference ground, whereby it is ensured that the main body portion 41 and the land 42 do not differ largely in impedance.

Note that the embodiment of the present disclosure is not limited to the above-described embodiment. For instance, while the multilayer board 30 has been a four-layer board in the above description, the number of the layers of the multilayer board may be other than four. In addition, while a configuration wherein the reference ground for the main body portion 41 is provided in the first pattern layer, as counted after the front surface of the board where the signal line 40 is formed, and the reference ground for the land 42 is provided on the second pattern layer, has been illustrated in the above description, the reference grounds may be provided in other pattern layer such as the third pattern layer. Besides, the reference ground for the land 42 may be disposed on the back surface side of the multilayer board 30.

The present disclosure contains subject matter related to that disclosed in Japanese Priority Patent Application JP 2017-027025 filed in the Japan Patent Office on Feb. 16, 2017, the entire content of which is hereby incorporated by reference.

It should be understood by those skilled in the art that various modifications, combinations, sub-combinations and alterations may occur depending on design requirements and other factors insofar as they are within the scope of the appended claims or the equivalent thereof.

What is claimed is:

1. A communication apparatus comprising:
   a signal line that connects an antenna and a wireless communication module to each other, the signal line having a portion where the signal line is divided in part into sections, with an adjacent portion adjacent to the divided portion of the signal line being greater in line width than a main body portion of the signal line;
   a first ground pattern disposed to face the main body portion; and
   a second ground pattern disposed to face the adjacent portion,
   wherein the distance from the adjacent portion to the second ground pattern is longer than the distance from the main body portion to the first ground pattern, and
   the antenna and the wireless communication module are connected to each other through the signal line and a solder adhered to the adjacent portion.

2. The communication apparatus according to claim 1, wherein the signal line is divided from the antenna at the position of an end portion thereof on the antenna side.

3. The communication apparatus according to claim 1, wherein
   the signal line is formed on a front surface of a multilayer board,
   the first ground pattern is formed in a pattern layer inside the multilayer board, and
   the second ground pattern is formed in another pattern layer inside the multilayer board, the another pattern layer being different from the pattern layer in which the first ground pattern is formed, or on a back surface of the multilayer board.

4. The communication apparatus according to claim 3, wherein the adjacent portion is formed in a rectangular shape.

5. The communication apparatus according to claim 3, wherein a measurement land for connection of a measuring apparatus for performing measurement of the wireless communication module is connected to the signal line at a position more on the wireless communication module side than the adjacent portion.

6. The communication apparatus according to claim 5, wherein the measurement land is formed on the back surface of the multilayer board, and is connected to the signal line through a through-hole which penetrates the multilayer board.

7. The communication apparatus according to claim 6, wherein the through-hole is provided at a position deviated from a center position of the measurement land.

8. A method of manufacturing a communication apparatus, the method comprising:
   forming a signal line, a first ground pattern, and a second ground pattern, the signal line being for connection between an antenna and a wireless communication module, the signal line having a portion where the signal line is divided in part into sections, with an adjacent portion adjacent to the divided portion of the signal line being greater in line width than a main body portion of the signal line, the first ground pattern facing the main body portion, and the second ground pattern facing the adjacent portion;
   connecting a measuring apparatus to the signal line at a position more on the wireless communication module side than the adjacent portion and performing measurement of the wireless communication module; and
   soldering the divided portion to connect the wireless communication module and the antenna to each other, after the measurement of the wireless communication module is performed.

* * * * *